United States Patent [19]

Yap et al.

[11] Patent Number: 5,789,952
[45] Date of Patent: Aug. 4, 1998

[54] ANTI-LOCK CPU CLOCK CONTROL METHOD, CIRCUIT AND APPARATUS

[75] Inventors: Kok-Kean Yap, Milpitas; Teck-Ee Guan, San Jose, both of Calif.

[73] Assignee: Cypress Semiconductor Corporation, San Jose, Calif.

[21] Appl. No.: 641,538

[22] Filed: May 1, 1996

[51] Int. Cl.⁶ .................................................. H03B 19/00
[52] U.S. Cl. .......................... 327/114; 327/147; 327/295; 327/544
[58] Field of Search ............................. 327/114, 147, 327/295, 544

[56] References Cited

U.S. PATENT DOCUMENTS 5,155,380  10/1992  Hwang et al. .................... 327/310
5,254,888  10/1993  Lee et al. ........................ 307/480
5,378,935  1/1995   Korhonen et al. .............. 327/114
5,442,774  8/1995   Pickup et al. ................... 327/114
5,451,892  9/1995   Bailey ............................. 327/513
5,625,311  4/1997   Nakatsu ........................... 327/295

*Primary Examiner*—Margaret Rose Wambach
*Attorney, Agent, or Firm*—Bliss McGlynn, P.C.

[57] ABSTRACT

The present invention provides power saving features that can be used in a computer or other device employing an internal clock to dynamically change the frequency at which the clock operates to respond to demands upon system resources. For example, the CPU clock in the synchronous logic core may be changed dynamically to reduce power consumption without causing a CPU lock-up. A PLL clock internal to the CPU has a reduced sensitivity to external clock changes. The present invention provides a means to incrementally change the internal clock frequency by intermittently stopping the output of the internal clock.

21 Claims, 3 Drawing Sheets

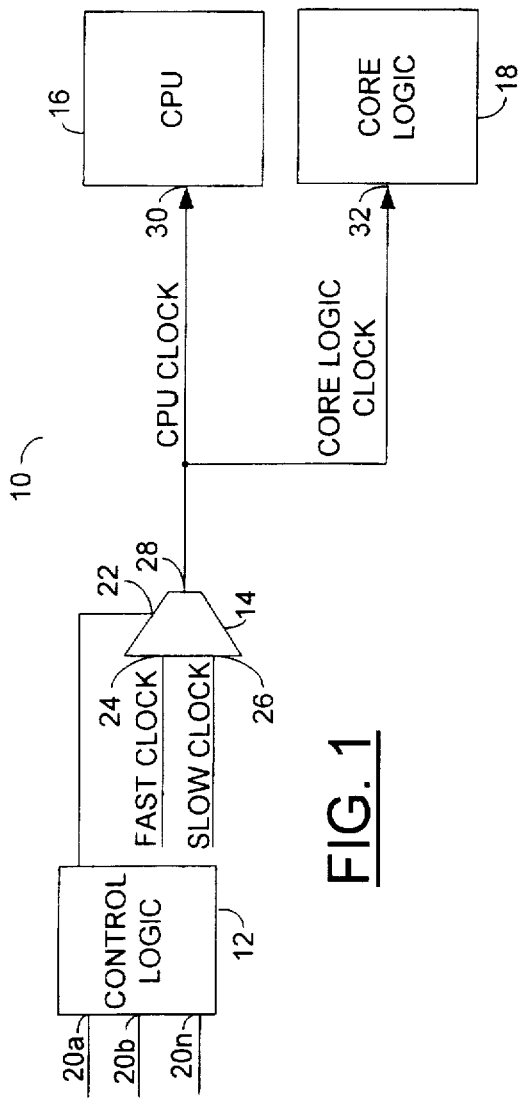
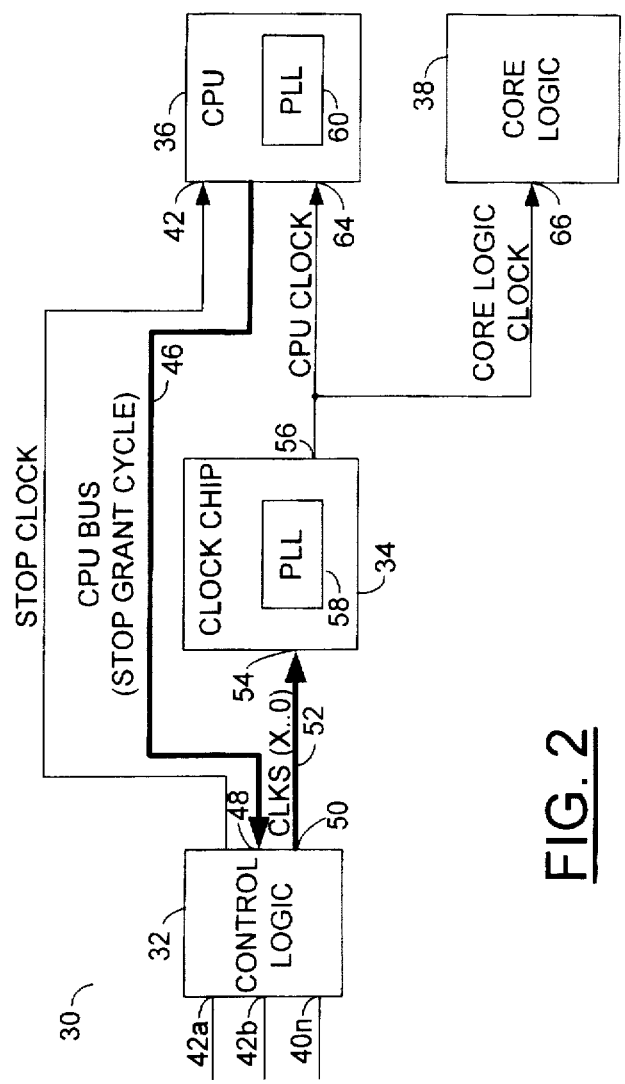

ANTI-LOCK CPU CLOCK CONTROL METHOD, CIRCUIT AND APPARATUS

FIELD OF THE INVENTION

The present invention relates to processors generally and more particularly, to an anti-lock method and apparatus to dynamically control external and internal CPU clocks and core logic of a computer providing efficient power management.

BACKGROUND OF THE INVENTION

Recent trends in the personal computer (PC) industry have been driving computer systems to use less electrical power. One way to reduce the consumption of power is to shut down certain functions of the computer when no activity is detected after a predetermined period of time. One way of reducing such power consumption after a predetermined period of time is to slow down the central processing unit (CPU) external clock. When new activity is detected, a wake-up signal is generated that causes the external CPU clock to be returned to a normal (e.g., faster) operating frequency.

FIG. 1 illustrates a circuit 10 for implementing such an approach. The circuit 10 has a control logic block 12, a multiplexer section 14, a CPU 16 and core logic 18. The control logic 12 has a number of inputs 20a, 20b ... 20n. Each of the inputs 20a–20n receives a signal that represents a power saving event. When a signal is detected at one of the inputs 20a–20n, the control logic block 12 presents a signal to an input 22 of the multiplexer section 14. The multiplexer section 14 also has an input 24 that receives a fast clock signal and an input 26 that receives a slow clock signal. The fast clock signal is generally representative of the normal operating clock frequency required by the CPU 16. The slow clock signal received at the input 26 is generally representative of a power saving clock frequency. By switching to a slow clock signal, less power is consumed by the circuit 10. The multiplexer section 14 presents a signal at an output 28 that is received as a CPU clock at an input 30 of the CPU 16 and as a core logic clock at an input 32 of the core logic 18. The signal present at the output 28 switches between a deasserted and an asserted state corresponding to when the circuit 10 detects a wake-up activity as opposed to a timeout. When the signal at the output 28 is deasserted, the CPU 16 receives the fast clock signal at the input 24. When the signal present at the output 28 is asserted, the CPU 16 receives the slow clock signal at the input 24. The circuit of FIG. 1 is generally suitable for processor architectures up to the 80486. U.S. Pat. No. 5,254,888 illustrates a circuit useful in the processor circuit shown in FIG. 1.

Modern CPU architectures in the 80586 and 80686 class, such as the Pentium, the Pentium Pro and the various Pentium compatible processors, generally rely on an internal Phase Lock Loop (PLL) to generate X2.5, X2 and X1.5 frequencies used in normal operation. The X2.5, X2 and X1.5 frequencies are bus frequencies generally derived from a single frequency using the PLL. An example is shown in application Ser. No. 08/549,915 incorporated by reference in its entirety. The bus frequency clock design, when implemented with a PLL, may make the circuit 10 undesirable. The PLL internal to the CPU 16 is so sensitive to the dynamic frequency change provided by the simple two clock multiplexer approach that modern CPU architectures may lock-up, an undesirable result.

SUMMARY OF THE INVENTION

The present invention provides multiple power saving states that can be dynamically switched to respond to demands upon system resources. In accordance with the present invention, the frequency of the CPU clock in the synchronous logic core may be changed dynamically without causing a CPU lock-up. Therefore, the present invention enables a CPU to enjoy more efficient power management.

The objects, features and advantages of the present invention include (a) the power savings that may result from dynamically switching an internal clock to a lower operating frequency and (b) a decreased risk of the CPU to lock-up. The present invention provides multiple clock frequencies that can be adjusted in response to demands placed on the computer system. As a result, the present invention allows the internal clock of the CPU to be operated at a reduced frequency, preferably the minimum frequency necessary to provide adequate CPU computing power. The present invention is generally compatible with existing CPU architectures.

BRIEF DESCRIPTION OF THE DRAWINGS

These and other objects, features and advantages of the present invention will be apparent from the following detailed description and the appended claims and drawings in which:

FIG. 1 is a block diagram of a conventional multiple frequency power saving circuit;

FIG. 2 is a block diagram of a preferred embodiment of the present invention;

DETAILED DESCRIPTION OF THE PREFERRED EMBODIMENTS

Figure 3:
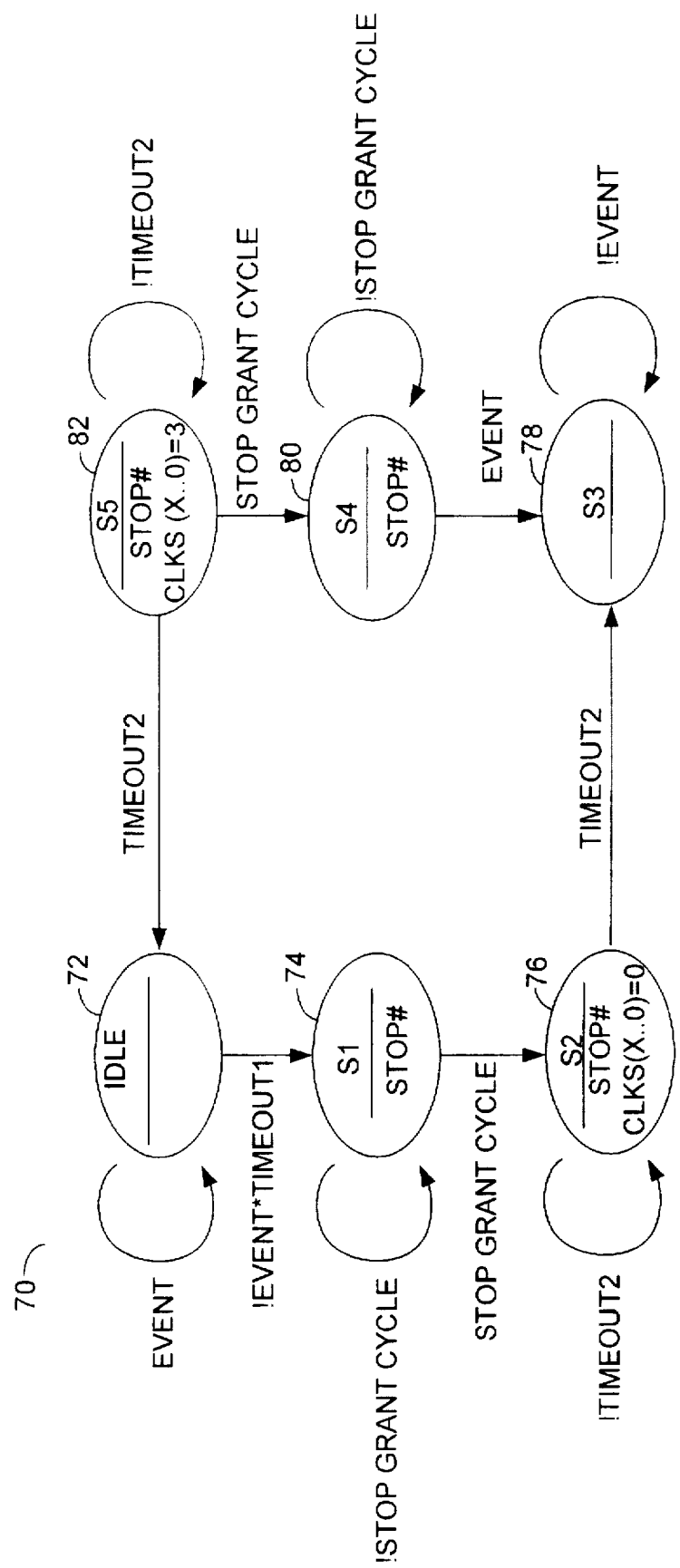
FIG. 3 is a state diagram for the control logic of the present invention.

Referring to FIG. 2, a block diagram of a circuit 30 is shown in accordance with a preferred embodiment of the present invention. The circuit 30 generally comprises a control logic block 32, a clock block 34, a CPU 36 and a core logic block 38. The control logic block 32 has a number of inputs 40a, 40b ... 40n. Each of the inputs 40a–40n receives a signal that represents a conventional power saving event. One example of a power saving event occurs when no demands are placed on the CPU 36 after a predetermined period of time. When a signal is detected at one of the inputs 40a–40n, the control logic block 32 presents a stop clock signal to input 42 of the CPU 36. The CPU 36 has an output 44 that may present a multi-bit signal to a CPU bus 46. The CPU bus 46 presents the signal to an input 48 of the control logic 32. The control logic block 32 may also have an output 50 that presents a control signal CLKS[X ... 0] through a bus 52 to input 54 of the clock source or clock block 34. The control signal represents a clock frequency selection signal presented from the control logic block 32 to the clock block 34. The control signal (e.g., CLKS[X ... 0]) may represent a parallel or serial multi-bit bus or bit stream signal received at the control input 54 which may be controlled by CPU (e.g., using a timer), and can be implemented using hardware or software. In a further embodiment, the present invention also concerns the software (e.g., a program in a tangible medium, such as a floppy disk, hard drive, programmable logic device [see, for example, pages 1—1 through 1-3 of the "CYPRESS Programmable Logic Data Book 1996", available from CYPRESS SEMICONDUCTOR CORP., San Jose, Calif.], etc.) embodied in the stop clock signal means, clock frequency selection means, and/or logic block 32. The clock signal may determine the number of individual clock frequencies which may be presented at the output 56. Specifically, if the control input 54 is a 2-bit input, the number of clocks would be $2^N$ where N equals the number of bits. Therefore, when N=2, $2^2$ (or 4) individual clock frequencies may be presented at the output 56. Each individual clock frequency may correspond to an operating mode of the CPU 36. Generally, a slower frequency clock signal may be used when the CPU 36 is in a less active state and a faster frequency clock signal may be used when the CPU 36 is in a more active state. If the control input 54 is a 3-bit signal, $2^3$, or eight individual clock signals are available. The number of clocks available at the output 56 can be modified or changed to fit the design criteria of a particular application.

In a preferred embodiment, clock chip 34 has an internal PLL 58. Similarly, in a further preferred embodiment, CPU 36 has an internal PLL 60. Clock chip 34, which may oscillate at one or more of a plurality of frequencies, has an output 56 that presents one of the frequencies to an input 64 of the CPU 36 as well as to an input 66 of the core logic 38. The CPU clock 60 may oscillate at a frequency within the range defined by the minimum and maximum frequencies as defined by the specification of a particular CPU. Accordingly, the CPU clock oscillating frequency may be changed in either direction and in any amount, preferably so long as it does not exceed either endpoint of the range in the CPU specification.

The stop clock signal received at input 42 of CPU 36 provides a signal that shuts down internal PLL 60 and may cause the CPU to "idle" or "sleep" (i.e., cease operating or running one or more applications). The stop clock signal causes the internal PLL 60 to stop oscillating (or disables the CPU internal clock) when asserted. Internal PLL 60 resumes oscillating when the stop clock signal is deasserted. In an alternate implementation, a first stop clock signal may be used to cause the internal PLL 60 to stop oscillating while a second stop clock signal may be used to cause the internal PLL 60 to resume oscillating. CPU 36 may then present a stop grant cycle signal to input 48 of the control logic 32. The stop grant cycle signal indicates to the stop clock signal means (e.g., logic 32) that CPU 36 is idling or sleeping (i.e., is in a state in which the CPU core has ceased operating). The CPU clock frequency signal received at the input 64 may now be safely changed without causing the CPU 36 to lock-up. The control logic 32 then presents the clock frequency selection signal to the clock block 34, which may comprise one or more clock sources capable of providing an external clock signal over a wide range of signal frequencies. The clock block 32 then sends a clock signal of the selected frequency to the CPU 36, and the internal clock changes its oscillating frequency to generally match the selected frequency. The oscillating frequency of the internal and external clocks may then be permitted to stabilize for a predetermined period of time. The stop clock signal present at the input 42 is then deasserted which generally allows the CPU 36 to become active again. The optional predetermined time delay (TIMEOUT2) may prevent an unstable clock frequency (i.e., one which may cause the CPU to lock-up) from being fed into PLL 60 of CPU 36

FIG. 3 shows a state diagram 70 for the control logic 32. The ellipse 72 represents an idle state of the control logic 32. The control logic 32 will continue to idle 72 until a power saving event occurs. A typical power saving event occurs when no demands are placed on the CPU. For example, see U.S. Pat. No. 5,254,888, incorporated by reference in its entirety. If no activity is detected for the duration of a signal TIMEOUT1, the control logic 32 changes to the state S1 shown by the ellipse 74. At this point control logic 32 sends a stop clock signal and waits for a return stop grant cycle signal from CPU 36. When the stop grant cycle signal is received, the control logic 32 proceeds to a state S2 represented by an ellipse 76. At this point, control logic 32 sends the control signal (e.g., CLKS[X . . . 0]), which changes the clock frequency presented to the CPU. After a predetermined delay (TIMEOUT2) to assure that the new frequency has stabilized. Control logic 32 proceeds to a state S3 represented by an ellipse 78. In the example where the CPU is in an active or more active state, (e.g., no power saving events) and the control logic is IDLE (see ellipse 72) the ellipse 78 may represent a less active or "power saving" state when the control logic is in state S3, and vice versa. The control logic 32 will idle until a second event occurs. The second event may represent either a second power saving event or the awakening (or increased activity) of the CPU. At this point the control logic 32 proceeds through a state S4 represented by an ellipse 80 and a state S5 represented by an ellipse 82 to proceed back to the idle state represented by the ellipse 72. The ellipses 78, 80 and 82 represent states similar to those of ellipses 72, 74 and 76. It should be noted that when the control logic 32 proceeds from the ellipse 82 to the ellipse 72, the frequency of oscillation of the internal clock may be the same as or different from its original frequency of oscillation. This allows for multiple power saving frequencies to occur.

Figure 4:
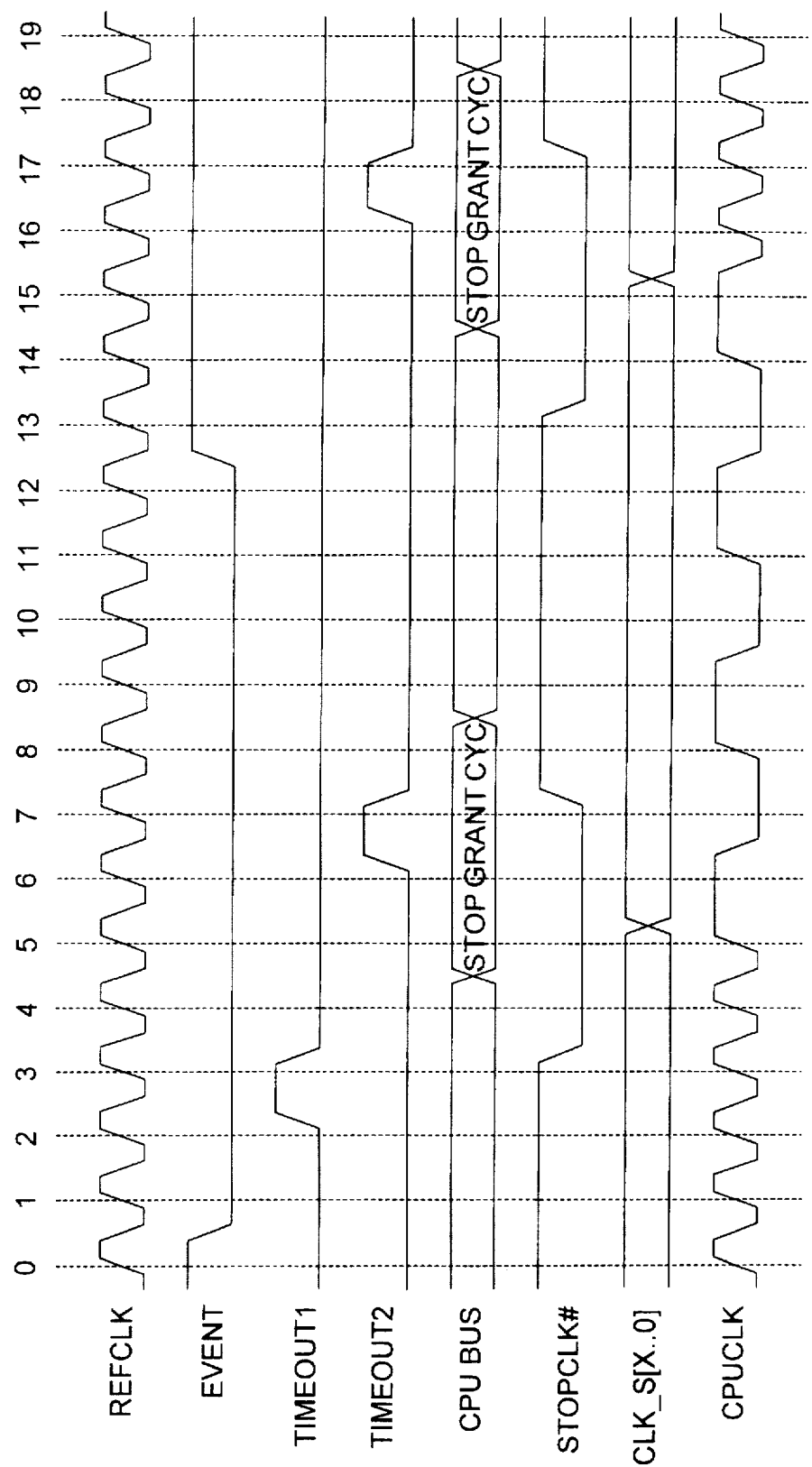
FIG. 4 is a timing diagram in accordance with a preferred embodiment of the present invention.

FIG. 4 shows representative timing diagram for an example of the present invention. After the signal EVENT changes states and the signal TIMEOUT1 occurs, the signal STOPCLK is asserted. Thereafter, a return STOP GRANT CYCLE signal is transmitted from the CPU to the control logic through the CPU bus. After the STOP GRANT CYCLE signal is received, the clock frequency is changed to a second, different frequency by the signal $CLK_{13}S[X . . . 0]$. The signal CPUCLK may then immediately change operating frequency (or change within one or more cycles of the reference clock signal REFCLK), although it is not received by the CPU since the stop clock signal continues to be asserted. After the signal TIMEOUT2 occurs, the signal STOPCLK is deasserted and the new frequency of the internal clock signal is received by the CPU. The number of clock cycles of the signal REFCLK shown by each of the different clock signals is shown for illustrative purposes only. Similar functions occur when the signal CPUCLK changes back to the first frequency.

The present invention may be used in a conventional personal computer operating a graphical user interface (GUI). A significant amount of CPU resources are used to initially load the operating system. Similarly, when an application program (i.e., such as a word processing program, a spreadsheet program or a data base program) is loaded, a large amount of CPU resources are used. However, once the operating system or application program is loaded, the demand on the CPU may diminish. This is particularly true in an application program where data is inputted into the system at a level determined by the maximum typing speed of the person inputting the data. For example, inputting data into a word processor at an exceptional rate of 130 words per minute, while fairly difficult for the computer operator, generally uses only minimal computational resources of the CPU. Thus, the present invention can slow the frequency of the internal PLL clock on the CPU during periods when the CPU is not loading the operating system or an application program to save power consumed by the CPU. This is particularly advantageous for laptop or portable computers.

While the invention has been particularly shown and described with reference to preferred embodiments thereof, it will be understood by those skilled in the art that various changes in form and details may be made without departing from the spirit and scope of the invention.

We claim:

1. A circuit comprising:
   external clock signal means comprising a phase locked loop for generating an external clock signal operating at one of a plurality of frequencies;
   clock frequency selection means connected to said external clock signal means, wherein said clock frequency selection means provides a multi-bit control signal to said external clock signal means to select said one of said plurality of frequencies;
   processor means having an internal clock, said processor means connected to said external clock signal means;
   means for generating said control signal in response to one or more event signals; and
   stop clock signal means connected to said processor means.

2. The circuit according to claim 1 wherein said multi-bit signal is an N-bit wide bus where the number of clock signals is $2^N$.

3. The circuit according to claim 2 further comprising means for providing a first delay.

4. The circuit according to claim 3 further comprising means for providing a second delay, wherein said first delay occurs prior to disabling said internal clock and said second delay occurs prior to enabling said internal clock.

5. The circuit according to claim 4 wherein said first and second delays are independently programmable.

6. A computer, laptop computer or portable computer comprising the circuit of claim 1.

7. The circuit according to claim 6 wherein said external clock signal means comprises a phase lock loop.

8. The circuit according to claim 6 further comprising means for generating one or more event signals.

9. The circuit according to claim 6 wherein said clock frequency selection means provides a multi-bit signal to said external clock signal means.

10. The circuit of claim 6, wherein said internal clock comprises a phase locked loop.

11. A method for changing power consumption in a processor having an internal clock operating at a first frequency comprising the steps of:
    (a) asserting a stop clock signal at said processor, thus disabling said internal clock and causing the processor to idle;
    (b) inputting to said processor a clock signal having a second frequency selected from a plurality of frequencies, said second frequency being different from said first frequency; and
    (c) deasserting said stop clock signal, thus enabling said internal clock to oscillate at said second frequency and causing the processor to resume operation.

12. The method according to claim 11 wherein said second clock frequency is less than said first clock frequency.

13. The method according to claim 12 wherein said stop clock signal is asserted after a power saving event.

14. The method according to claim 13, further comprising, prior to said asserting step, the step of transmitting an event signal from said processor to logic controlling said stop clock signal.

15. The method according to claim 11 wherein said second clock frequency is greater than said first clock frequency.

16. The method according to claim 11, further comprising the step of waiting for a predetermined period of time after said inputting step and before said deasserting step.

17. The method of claim 11, further comprising repeating said method.

18. A circuit comprising:
    a logic circuit capable of generating (i) a clock frequency selection signal configured to select one of a plurality of frequencies and (ii) a stop clock signal configured to disable an internal oscillator, both in response to one or more event signals;
    a phase locked loop configured to (a) generate a clock signal and (b) oscillate at said one of said plurality of frequencies in response to said clock frequency selection signal; and
    a processor capable of receiving said clock signal and said stop clock signal, said processor entering an idle state in response to said stop clock signal.

19. The circuit according to claim 18 wherein said processor comprises an internal phase lock loop capable of providing an internal clock signal.

20. The circuit according to claim 18, wherein said processor further comprises said internal oscillator, said internal oscillator being disabled in response to said stop clock signal.

21. The circuit according to claim 20, wherein said processor asserts a stop grant cycle signal in response to said stop clock signal, and after said processor asserts said stop grant cycle signal, said internal clock oscillates at said one of said plurality of frequencies in response to said clock signal.

* * * * *